(12) United States Patent
Chang et al.

(10) Patent No.: US 10,892,208 B2
(45) Date of Patent: Jan. 12, 2021

(54) HEAT DISSIPATION APPARATUS AND METHOD FOR POWER SEMICONDUCTOR DEVICES

(71) Applicants: Hung-Li Chang, Chino Hills, CA (US); Lon C. Cooper, Azusa, CA (US); David L. Bogdanchik, Pasadena, CA (US)

(72) Inventors: Hung-Li Chang, Chino Hills, CA (US); Lon C. Cooper, Azusa, CA (US); David L. Bogdanchik, Pasadena, CA (US)

(73) Assignee: BEIJING E. MOTOR ADVANCE CO. LTD., Beijing (CN)

( * ) Notice: Subject to any disclaimer, the term of this patent is extended or adjusted under 35 U.S.C. 154(b) by 0 days.

(21) Appl. No.: 15/787,711

(22) Filed: Oct. 19, 2017

(65) Prior Publication Data
US 2019/0139862 A1 May 9, 2019

(51) Int. Cl.
*H01L 23/473* (2006.01)
*H01L 23/367* (2006.01)
*H01L 25/11* (2006.01)
*H01L 23/40* (2006.01)

(52) U.S. Cl.
CPC ........ *H01L 23/473* (2013.01); *H01L 23/3672* (2013.01); *H01L 23/3675* (2013.01); *H01L 23/4093* (2013.01); *H01L 25/115* (2013.01); *H01L 25/112* (2013.01)

(58) Field of Classification Search
CPC ....... H01L 23/34; H01L 23/36; H01L 23/367; H01L 23/3672; H01L 23/46; H01L 23/473
See application file for complete search history.

(56) References Cited

U.S. PATENT DOCUMENTS

2017/0271240 A1* 9/2017 Inoue .................... H01L 23/473

\* cited by examiner

*Primary Examiner* — Thanhha S Pham
(74) *Attorney, Agent, or Firm* — The Law Office of Kevin M. Welch; Kevin Matthew Welch

(57) ABSTRACT

An improved heat dissipation apparatus for limiting the temperature of multiple power semiconductors featuring flow balancers to manipulate the hydrodynamic pressure of the coolant fluid to regulate the coolant fluid flow distribution across the heat exchange fins to either create uniform flow distribution or purposefully disproportionate or custom coolant fluid flow distribution for the purpose of achieving higher heat transfer efficiency.

7 Claims, 3 Drawing Sheets

HEAT DISSIPATION APPARATUS AND METHOD FOR POWER SEMICONDUCTOR DEVICES

FIELD OF THE PRESENT DISCLOSURE

This disclosure relates generally to heat dissipation apparatus and methods of use and more specifically to an improvement to a heat dissipation apparatus and method of use for power semiconductors capable of improving thermal efficiency through optimizing coolant fluid flow.

BACKGROUND OF THE RELATED ART

In any apparatus that contains power semiconductor devices, such as switches or rectifiers, heat dissipation is a critical issue. Excessive heat can lead to deterioration of both physical and electrical properties which in turn can cause both intermittent and permanent failures. Even within tolerable heat ranges, cooler operating temperatures are almost always desirable because cooler operating temperatures typically lead to increased efficiency which, depending on the performance demands on a particular device, may allow a device to operate longer, consume less power, tolerate or endure higher power, or even be redesigned to be physically smaller. In some fields of technology these advantages are of critical importance so even marginal increases in heat dissipation efficiency can be of great importance.

To achieve lower operating temperatures, power semiconductor devices are typically coupled with a heat sink or a heat dissipation device of some variety. The most efficient heat dissipation devices typically involve a thermally conductive material in physical contact or in close physical proximity to a power semiconductor device which is capable of drawing heat out of a power semiconductor device and transferring the heat energy away from its source for dispersion or dissipation in a more convenient location or at a more convenient pace. Some of the more effective heat dissipation devices achieve this end through the use of liquid coolants.

U.S. Pat. No. 9,443,786 ("the '786 patent") describes one such heat dissipation device that includes at least one serpentine fin in thermal communication with one or more power semiconductor devices via thermally conductive plates. The serpentine fin(s) are situated between an upper and lower plenum within a manifold that features an influent and effluent located proximate the opposing distal ends of the manifold such that cooling fluid must travel the length of the manifold before exiting. The '786 patent is incorporated by reference in its entirety into this specification, including the abstract, entire specification, drawings, and claims.

When this legacy design is in a horizontal orientation, cooling fluid enters the apparatus through the influent that feeds into the upper plenum and exits the apparatus through the effluent that draws from the lower plenum so in order to pass through the apparatus coolant fluid must flow vertically from the upper plenum to the lower plenum across the serpentine fin(s) at some point. The serpentine fin(s) serves as a heat exchange surface such that while the cooling fluid is passing vertically across the serpentine fin(s), heat energy generated in the attached power semiconductor devices flows from the serpentine fin(s) into the cooling fluid and is subsequently carried out through the apparatus' effluent with the coolant fluid for dissipation elsewhere.

The overall heat dissipation efficiency of the legacy device disclosed and claimed in the '786 patent depends on both the heat transfer efficiency from the power semiconductor device to the serpentine fin(s) via thermally conductive plates on which the semiconductor devices are mounted, and the heat transfer efficiency from the serpentine fin(s) to the coolant fluid. The latter is dependent, in part, on the coolant fluid flow distribution across the serpentine fin(s).

It has been observed that if the shape of each plenum within the manifold is equal and uniform in size as depicted in the '786 patent, specifically FIG. 7B, then a disproportionate amount of cooling fluid will pass vertically across the serpentine fin(s) at particular locations along it horizontal length. In applications where the power semiconductor devices have approximately equal power dissipation, this uneven coolant fluid flow distribution does not achieve the maximum possible heat transfer efficiency; therefore, there exists a need to improve the apparatus and method disclosed and claimed in the '786 patent such that the cooling fluid flow is manipulated to pass over the serpentine fin(s) more evenly to achieve maximum heat transfer optimization.

In other applications, however, the power semiconductor devices transferring heat to the serpentine fin(s) are of either differing size or differing thermal activity. In such applications, a uniform and even distribution of coolant fluid across the horizontal length of the serpentine fin(s) may not be the most efficient flow distribution profile to facilitate maximum heat transfer efficiency. There exists a need to improve the apparatus and method disclosed and claimed in the '786 patent such that the cooling fluid flow may be manipulated to create custom, non-uniform flow distributions over the horizontal length of the serpentine fin(s) to fully optimize heat transfer efficiency.

For example, the device disclosed and claimed in the '786 patent depicts six separate power semiconductor devices attached to thermally conductive plates along the visible side of the illustrated apparatus (See FIG. 1 of the '786 patent) and the disclosure indicates there may be up to another six power semiconductor devices attached to the other side. If the power semiconductor devices are not identical in size and/or if some power semiconductor devices are more thermally active than others, then to achieve optimal heat transfer efficiency, the flow of the coolant fluid should be manipulated such that the portion of the serpentine fin(s) that are adjacent the more thermally active power semiconductor devices experience a disproportionately greater amount of coolant flow. There exists a need to manipulate the coolant fluid flow distribution in a disproportionate manner to allocate more heat dissipation capacity to portions of the heat exchange surface adjacent the more thermally active power semiconductor devices in an effort to achieve the highest possible heat dissipation efficiency.

In addition to needing improved coolant flow distribution, the apparatus disclosed and claimed in the '786 patent can be made more versatile by enhancing the electrical isolation of the multiple power semiconductor devices in thermal communication with the serpentine fins(s) or other heat exchange surface. The legacy design disclosed a metal plate or Direct Bond Substrate (DBC) in which the plate has a thermally conductive ceramic core and a copper layer on each side of the ceramic core. The power semiconductor devices are affixed to such plate and are electrically isolated from the serpentine fins(s) or other heat exchange surface but they are not electrically isolated from each other, thereby requiring some level of uniformity in terms of the variety of power semiconductor devices that are affixed adjacent to each other. If the power semiconductor devices are electrically isolated from each other, a single apparatus can accommodate electrically distinct semiconductor devices such as an inverter and a charger, or a one phase, three phase, and/or multiple phase power semiconductor device affixed to the same apparatus. This design innovation would provide the disclosed apparatus with greater versatility. There exists a need to improve the apparatus disclosed and claimed in the '786 patent so that the power semiconductor devices are electrically isolated from each other.

The present disclosure distinguishes over the related art providing heretofore unknown advantages as described in the following summary.

BRIEF SUMMARY OF THE INVENTION

The present disclosure describes an innovative highly efficient heat dissipation apparatus for power semiconductors. Improving upon the design initially disclosed and claimed in the '786 patent, the presently disclosed apparatus further includes innovative flow balancers to manipulate the hydrodynamic pressure of the coolant fluid to optimize the flow distribution of the coolant fluid across the serpentine fin or similar heat exchange surface which can reduce the temperature of the power semiconductors devices by as much as thirty-three percent (33%) compared to the legacy apparatus without the innovative modification.

Similar to the apparatus disclosed and claimed in the '786 patent, the presently disclosed apparatus includes a manifold with an influent that leads to a first plenum and effluent that draws from a second plenum and a heat exchange surface in thermal communication with at least one power semiconductor device located between the first and second plenum such that coolant fluid must flow in close proximity to the heat exchange surface to flow from the first plenum to the second plenum and out of the apparatus.

The innovative flow balancers are located inside the first and second plenum and alter the internal cross sectional area of the first and second plenums, thereby altering the cross sectional area along the length of each plenum which in turn alters the hydrostatic pressure along the length of the apparatus and affects the flow distribution of coolant fluid along the length of the heat exchange surface.

The flow balancers may take the form of removable physical inserts or permanently affixed physical inserts located inside the first and/or second plenum to alter the plenum cross sectional area. Alternatively, in some embodiments, the flow balancers may be physical design alterations to the shape of the plenum walls to achieve the same effect.

Through manipulating the shape of the first and second plenums with flow balancers, the hydrodynamic pressure in the manifold can be altered to either induce even flow distribution along the length of the heat exchange surface or purposefully create custom or uneven flow distributions.

According to Computational Fluid Dynamics (CFD) analysis, the use of flow balancers could improve junction temperatures of power semiconductors experiencing similar loading up to twenty-five percent (25%). Actual testing yielded even better results, showing temperature reductions as much as thirty-three percent (33%). These temperature reductions are significant and can translate into very important performance benefits which, depending on the technology, may allow devices to operate longer, consume less power, tolerate or endure higher power, and/or be redesigned to be physically smaller.

Another important innovative improvement in the presently disclosed apparatus involves the thermally conductive plate on which the power semiconductor devices are mounted. In the legacy design disclosed and claimed in the '786 patent, multiple power semiconductor devices were mounted on a single thermally conductive plate. This design is limiting because it did not electrically isolate the power semiconductor devices from each other and therefore require that the power semiconductor devices shared some electrical characteristic. The present disclosed apparatus features electrically isolated plates. This allows one phase, three phase, and/or multiple phase power semiconductor devices to be incorporated into one heat dissipation apparatus. This important innovation allows for greater design flexibility and versatility.

In the legacy design disclosed in the '786 patent, the heat transfer surface in is referred to as a serpentine fin. A serpentine fin is an excellent style of heat exchange surface but is not the only acceptable heat exchange surface design. For the purposes of this disclosure, the term serpentine fin shall refer to both a fin with a plurality of folds as described in the '786 and any other acceptable heat transfer surface designs.

This disclosure teaches certain benefits in construction and use which give rise to the objectives described below.

A primary objective inherent in the above described apparatus and method is to provide advantages not taught by the prior art.

Another objective is to provide a power semiconductor heat dissipation apparatus with increased heat dissipation capacity.

A further objective is to provide a power semiconductor heat dissipation apparatus with increased heat dissipation efficiency.

A still further objective is to provide a power semiconductor heat dissipation apparatus with decreased physical size.

A yet further objective is to provide a power semiconductor heat dissipation apparatus with improved electrical isolation between power semiconductor devices.

Other features and advantages of the present invention will become apparent from the following more detailed descriptions, taken in conjunction with the accompanying drawings, which illustrate, by way of example, the principles and features of the presently described apparatus.

BRIEF DESCRIPTION OF THE SEVERAL VIEWS OF THE DRAWING(S)

The accompanying drawings illustrate various exemplary implementations and are part of the specification. The illustrated implementations are proffered for purposes of example not for purposes of limitation. Illustrated elements will be designated by numbers. Once designated, an element will be identified by the identical number throughout. Illustrated in the accompanying drawing(s) is at least one of the best mode embodiments of the present disclosure. In such drawing(s):

DETAILED DESCRIPTION OF THE EXEMPLARY EMBODIMENT

The above described drawing figures illustrate an exemplary embodiment of the presently disclosed apparatus and its many features in at least one of its preferred, best mode embodiments, which is further defined in detail in the following description. Those having ordinary skill in the art may be able to make alterations and modifications to what is described herein without departing from its spirit and scope of the disclosure. Therefore, it must be understood that what is illustrated is set forth only for the purposes of example and that it should not be taken as a limitation in the scope of the present apparatus or its many features.

Described now in detail is a heat dissipation apparatus and method of use for power semiconductors capable of improving thermal efficiency through optimizing coolant flow through manipulating hydrodynamic force.

Figure 1:
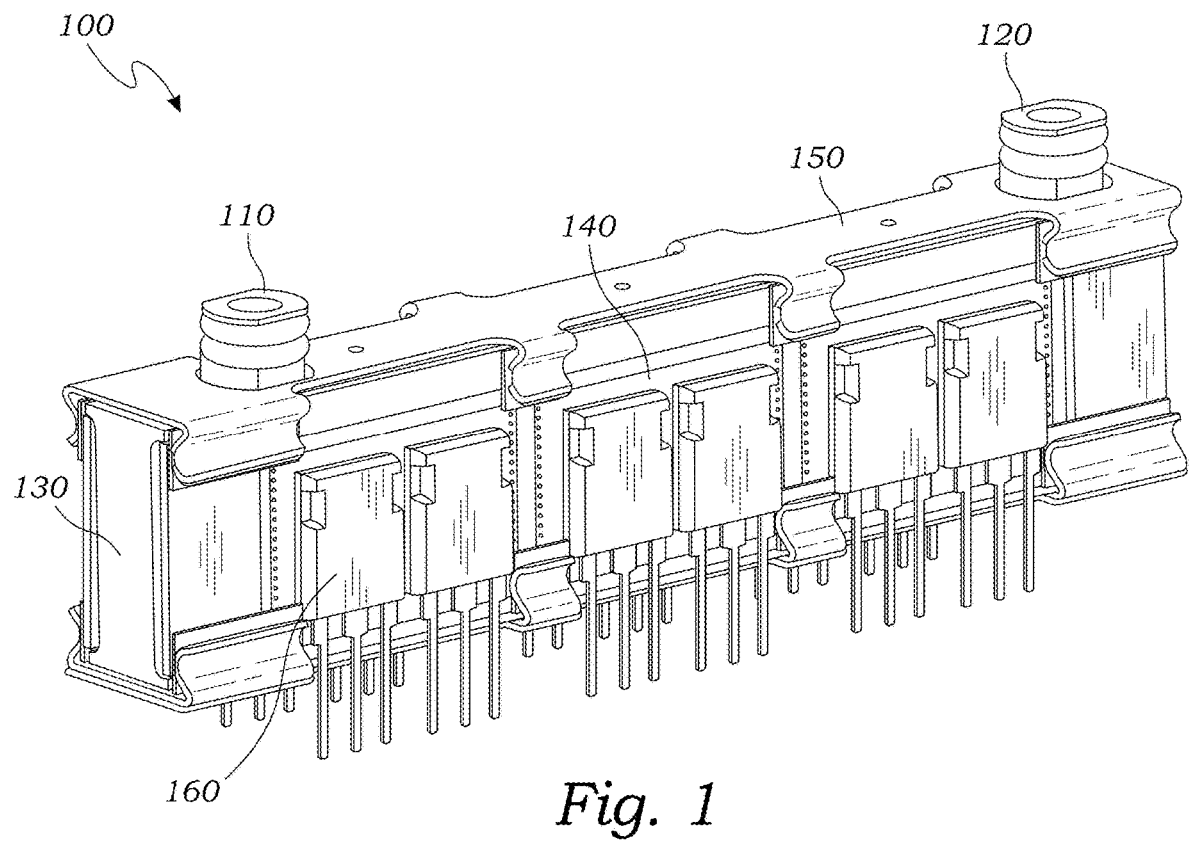
FIG. 1 is a perspective view of an exemplary embodiment of the presently disclosed heat dissipation apparatus featuring six power semiconductor devices affixed to each side of the apparatus.
Figure 2:
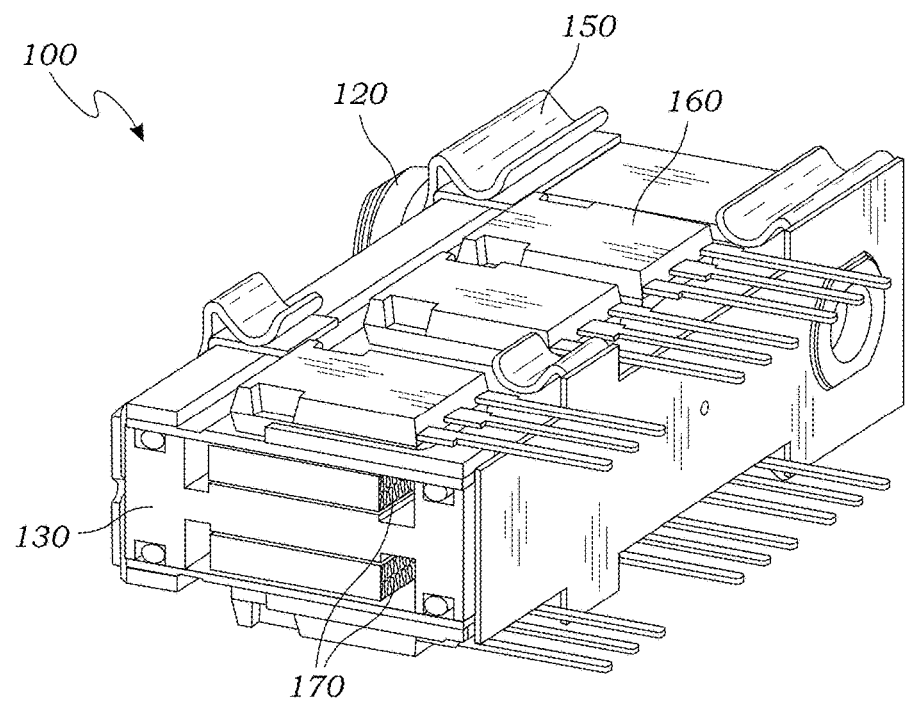
FIG. 2 is a cross-section perspective view of the presently disclosed heat dissipation apparatus exposing the serpentine cooling fins in the center of the apparatus.

FIG. 1 illustrates an exemplary embodiment of the presently disclosed innovative apparatus 100 featuring a manifold 130 with an influent 110 for ingress of coolant fluid and an effluent 120 for egress of cooling fluid. FIG. 1 is shown with multiple power semiconductor devices 160 affixed to thermally conductive pads 140 which are in thermal communication with an internally located heat exchange surface 170 so that heat generated in the power semiconductor devices 160 can be efficiently transferred through the thermally conductive pads 140 to the heat exchange surface 170 (located internally), and subsequently transferred to and carried away by the cooling fluid. The heat transfer surface 170 is visible in FIG. 2 because this illustration is a cut away perspective view.

Figure 3:
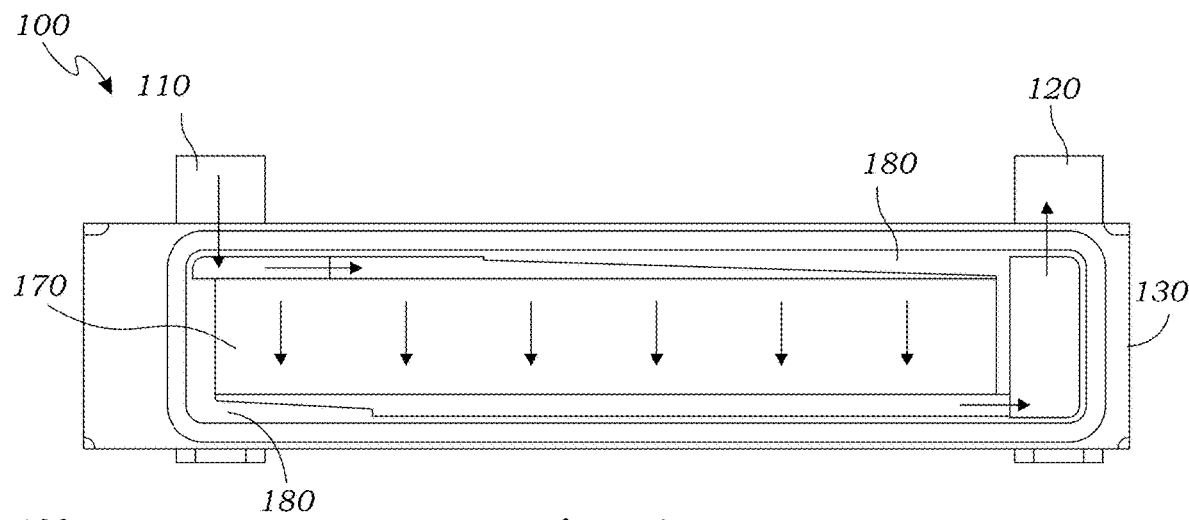
FIG. 3 is schematic side view of an exemplary embodiment of the presently disclosed heat dissipation apparatus illustrating presence of first and second flow balancers used to manipulate cooling fluid pressure to achieve equal flow across the horizontal length of the apparatus.
Figure 4:
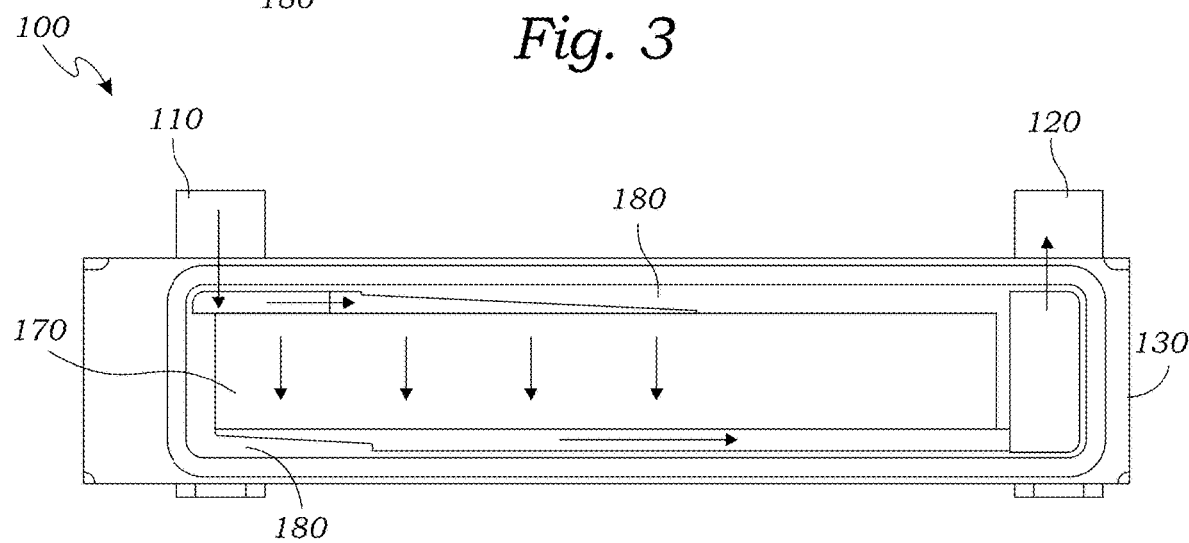
FIG. 4 is schematic side view of an exemplary embodiment of the presently disclosed heat dissipation apparatus illustrating presence of first and second flow balancers used to manipulate cooling fluid pressure to achieve equal flow across the initial half of the device while eliminating flow to the latter half of the apparatus.
Figure 5:
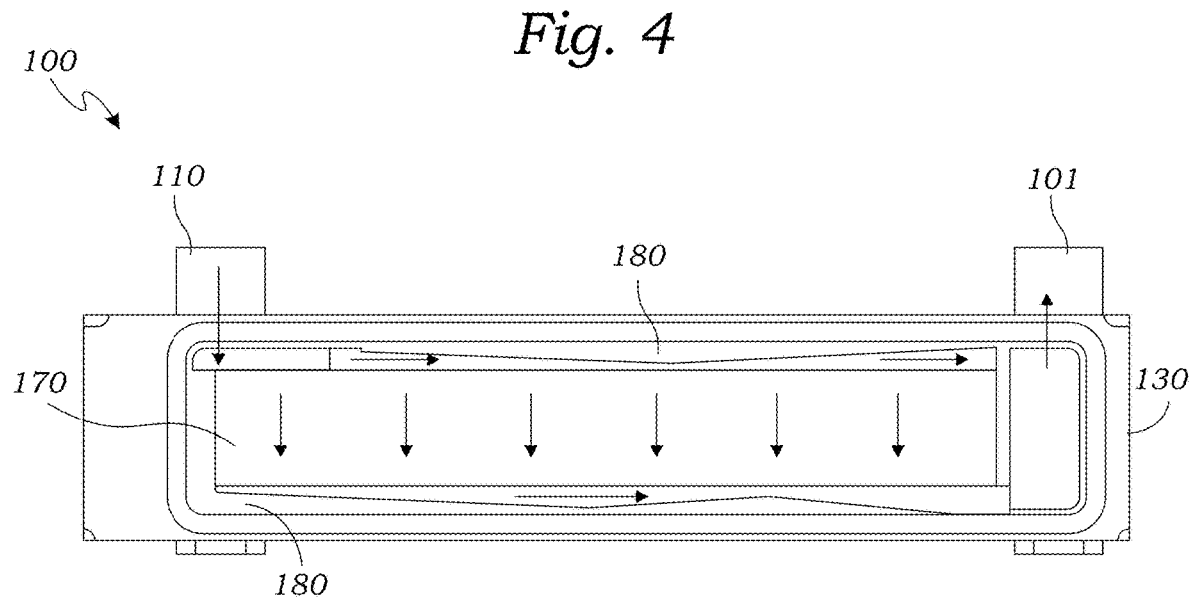
FIG. 5 is schematic side view of an exemplary embodiment of the presently disclosed heat dissipation apparatus illustrating presence of first and second flow balancers used to manipulate cooling fluid pressure to achieve a unique flow profile across the horizontal length of the apparatus.

FIGS. 3, 4, and 5 are schematic side view diagrams illustrating the influence that the innovative flow balancers 180 can exert over the coolant fluid flow distribution. Specifically, FIG. 3 illustrates a flow balancer 180 in both the first plenum and the second plenum designed to create even coolant fluid distribution across the heat exchange surface 170. This example might be for a situation where the apparatus is affixed to multiple similar power semiconductor devices that generate a roughly uniform heat signature across the length of the apparatus 100 and desire a relatively even coolant flow distribution.

Whereas FIG. 4 illustrates a flow balancer 180 in the first plenum completely closing off flow from the latter portion of the apparatus 100. This flow profile may be desired if there are no power semiconductor 160 devices affixed to latter half of the apparatus 100 and therefore no coolant fluid is needed. FIG. 5 an example of a hypothetical complex flow profile created by complex flow balancers 180 that may be desired if multiple different power semiconductor devices 160 are affixed to the apparatus 100 creating a need for a complex flow profile.

Figure 6:
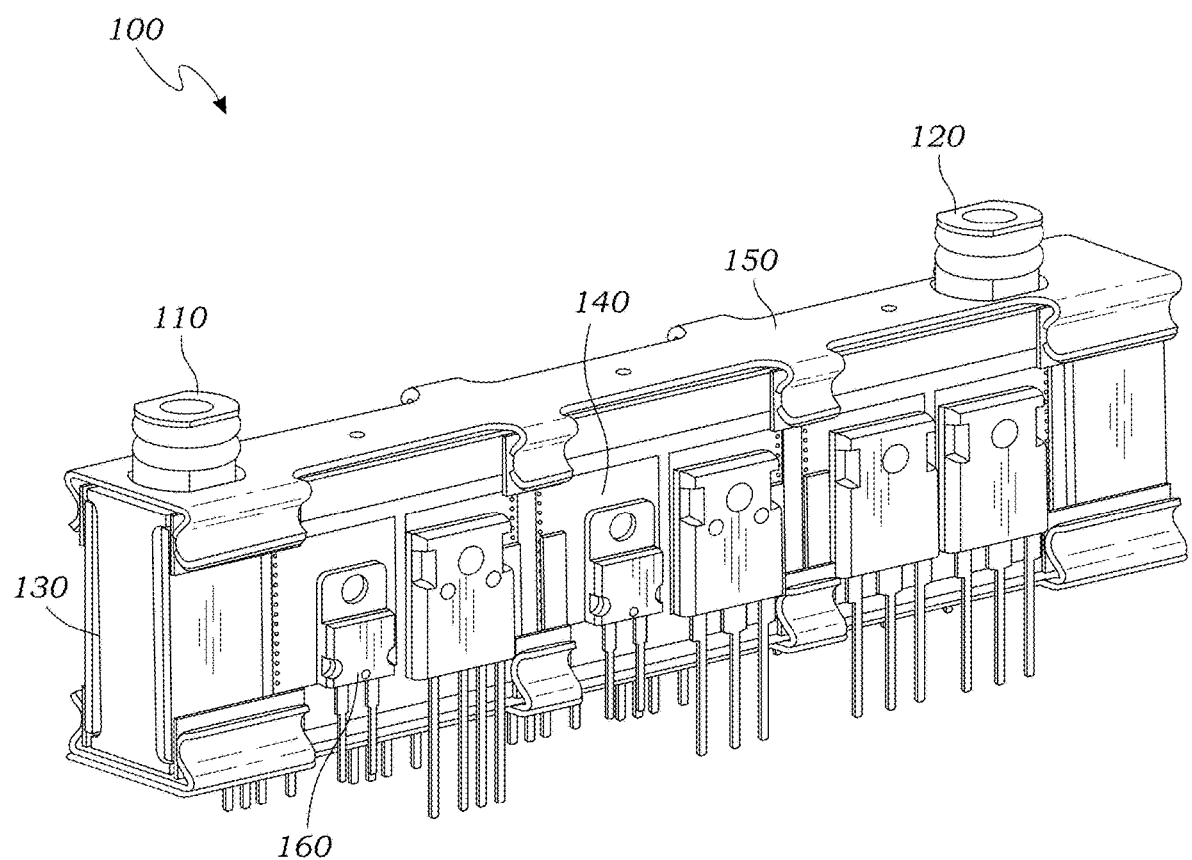
FIG. 6 is a perspective view of an exemplary embodiment of the presently disclosed heat dissipation apparatus featuring six semiconductor power devices of varying sizes affixed to each side of the apparatus.

FIG. 6 is perspective view on an exemplary view of the presently disclosed apparatus 100 illustrating power semiconductor devices 160 of varying sizes affixed to thermally conductive plates 140 that are electrically isolated from the other power semiconductor devices 160. The advantage of this design improvement is that is allows for greater design flexibility and versatility because various power semiconductor devices 160 that are affixed to the same apparatus 100 can be less similar, electrically.

The enablements described in detail above are considered novel over the prior art of record and are considered critical to the operation of at least one aspect of the apparatus and its method of use, and to the achievement of the above-described objectives. The words used in this specification to describe the instant embodiments are to be understood not only in the sense of their commonly defined meanings, but to include by special definition in this specification: structure, material, or acts beyond the scope of the commonly defined meanings. Thus, if an element can be understood in the context of this specification as including more than one meaning, then its use must be understood as being generic to all possible meanings supported by the specification and by the word(s) describing the element.

The definitions of the words or drawing elements described herein are meant to include not only the combination of elements which are literally set forth, but all equivalent structures, materials or acts for performing substantially the same function in substantially the same way to obtain substantially the same result. In this sense it is therefore contemplated that an equivalent substitution of two or more elements may be made for any one of the elements described and its various embodiments or that a single element may be substituted for two or more elements in a claim.

Changes from the claimed subject matter as viewed by a person with ordinary skill in the art, now known or later devised, are expressly contemplated as being equivalents within the scope intended and its various embodiments. Therefore, substitutions, now or later known to one with ordinary skill in the art, are defined to be within the scope of the defined elements. This disclosure is thus meant to be understood to include what is specifically illustrated and described above, what is conceptually equivalent, what can be obviously substituted, and also what incorporates the essential ideas.

The scope of this description is to be interpreted only in conjunction with the appended claims and it is made clear, here, that each named inventor believes that the claimed subject matter is what is intended to be patented.

What is claimed is:

1. An improved power semiconductor heat dissipation apparatus, said apparatus comprising:
    a liquid heat exchange manifold featuring:
    an influent through which coolant fluid may flows into said manifold;
    an effluent through which coolant fluid may flow out of said manifold;
    a heat exchange surface positioned within said manifold between the influent and effluent such that the coolant fluid must flow past said heat exchange surface to flow from said influent to said effluent;
    a first plenum defined by the space within said manifold between the influent and the heat exchange surface;
    a second plenum defined by the space within said manifold between the heat exchange surface and the effluent;

at least one power semiconductor mounted externally to said manifold in thermal communication with said heat exchange surface; and wherein said influent provides cooling fluid ingress to said first plenum and said effluent provides cooling fluid egress from said second plenum and said heat exchange surface extends between said first plenum and said second plenum such that cooling liquid must flow past said heat exchange surface to flow from said first plenum to said second plenum;

at least one flow balancer located inside and along the length of either the first or second plenum specifically shaped to manipulate the hydrodynamic pressure of the cooling fluid along the length of said heat exchange surface bordering said first plenum or second plenum to optimize coolant fluid flow distribution from the first plenum to the second plenum past said heat exchange surface.

2. An apparatus as in claim 1 further comprising at least two power semiconductor devices mounted externally to said manifold in thermal communication with said heat exchange surface, wherein said at least two power semiconductor devices are electrically isolated from each other.

3. An apparatus as in claim 1 further comprising at least two power semiconductor devices mounted externally to said manifold in thermal communication with said heat exchange surface, wherein said at least two power semiconductor devices are not electrically isolated from each other.

4. An apparatus as in claim 1, wherein the influent, the first plenum, the heat exchanger, the second plenum, and the effluent are all situated on the same horizontal plane.

5. An apparatus as in claim 1 wherein the influent, the heat exchanger, and the effluent are all situated on the same horizontal plane.

6. An apparatus as in claim 4 further comprising at least two power semiconductor devices mounted externally to said manifold in thermal communication with said heat exchange surface, wherein said at least two power semiconductor devices are electrically isolated from each other.

7. An apparatus as in claim 4 further comprising at least two power semiconductor devices mounted externally to said manifold in thermal communication with said heat exchange surface, wherein said at least two power semiconductor devices are not electrically isolated from each other.

* * * * *